United States Patent
Yoshida (10) Patent No.: US 10,468,268 B2
(45) Date of Patent: Nov. 5, 2019

(54) ETCHING METHOD

(71) Applicant: Tokyo Electron Limited, Tokyo (JP)

(72) Inventor: Ryoichi Yoshida, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/907,633

(22) PCT Filed: Aug. 18, 2014

(86) PCT No.: PCT/JP2014/071540
§ 371 (c)(1),
(2) Date: Jan. 26, 2016

(87) PCT Pub. No.: WO2015/029817
PCT Pub. Date: Mar. 5, 2015

(65) Prior Publication Data
US 2016/0163563 A1    Jun. 9, 2016

(30) Foreign Application Priority Data
Aug. 29, 2013   (JP) .................. 2013-178583

(51) Int. Cl.
*H01L 21/308* (2006.01)
*H01L 21/311* (2006.01)
(Continued)

(52) U.S. Cl.
CPC .... *H01L 21/31138* (2013.01); *H01J 37/3266* (2013.01); *H01J 37/32091* (2013.01);
(Continued)

(58) Field of Classification Search
CPC ............. H01L 21/31138; H01L 21/31144
See application file for complete search history.

(56) References Cited

U.S. PATENT DOCUMENTS

2004/0063327 A1* 4/2004 Chae ............. H01L 21/31116
                                                            438/706
2006/0118518 A1* 6/2006 Rusu ............. H01J 37/32082
                                                             216/67
(Continued)

FOREIGN PATENT DOCUMENTS

| CN | 101930179 | 12/2010 |
|----|-----------|---------|
| EP | 2618366   | 7/2013  |
| JP | 2001-151834 | 6/2001 |

OTHER PUBLICATIONS

Tsao C. W. et al., Low temperature bonding of PMMA and COC microfluidic substrates using UV/Ozone surface treatment. Lab on a Chip, Mar. 7, 2007, vol. 7, pp. 499-505 pp. 500, left column lines 1-13.

(Continued)

*Primary Examiner* — Thomas T Pham
(74) *Attorney, Agent, or Firm* — IPUSA, PLLC (57) ABSTRACT

There is provided an etching method for etching an object to be processed by using a substrate processing apparatus including a process chamber including a first electrode and a second electrode disposed opposite to the first electrode to receive the object to be processed thereon. The etching method includes a process of removing at least one of a first polymer and a second polymer by etching the object to be processed on which a pattern of the first polymer and the second polymer is formed by phase separation of a block copolymer containing the first polymer and the second polymer at a temperature lower than or equal to 10 degrees C. by using plasma of a process gas.

14 Claims, 3 Drawing Sheets

(51) Int. Cl.
*H01L 21/027* (2006.01)
*H01J 37/32* (2006.01)
*H01L 21/3105* (2006.01)
*B82Y 40/00* (2011.01)

(52) U.S. Cl.
CPC .... *H01J 37/32165* (2013.01); *H01L 21/0271* (2013.01); *H01L 21/31058* (2013.01); *H01L 21/31144* (2013.01); *B82Y 40/00* (2013.01)

(56) References Cited

U.S. PATENT DOCUMENTS

| | | | |
|---|---|---|---|
| 2007/0249172 A1* | 10/2007 | Huang | H01L 21/31138 438/711 |
| 2007/0281220 A1 | 12/2007 | Sandhu et al. | |
| 2009/0107953 A1 | 4/2009 | Cheng et al. | |
| 2011/0159699 A1* | 6/2011 | Gabriel | H01L 21/31116 438/725 |
| 2011/0201211 A1 | 8/2011 | Sinha et al. | |
| 2012/0048738 A1* | 3/2012 | Fujikawa | C23C 18/54 205/50 |
| 2012/0135159 A1* | 5/2012 | Xiao | B81C 1/00031 427/534 |
| 2012/0214313 A1* | 8/2012 | Ooya | H01J 37/32091 438/712 |
| 2013/0078576 A1* | 3/2013 | Wu | C08F 293/00 430/296 |
| 2013/0119018 A1* | 5/2013 | Kanarik | H05H 1/46 216/67 |
| 2013/0196511 A1 | 8/2013 | Nishimura et al. | |
| 2014/0087486 A1* | 3/2014 | Vegh | H01L 21/31116 438/4 |
| 2014/0131839 A1* | 5/2014 | Chan | G03F 7/0002 257/618 |
| 2014/0370717 A1* | 12/2014 | Chakrapani | H01L 21/31138 438/725 |
| 2014/0370718 A1 | 12/2014 | Chakrapani et al. | |

OTHER PUBLICATIONS

Bruce R et al: "Study of ion and vacuum ultraviolet-induced effects on styrene- and ester-based polymers exposed to argon plasma", Journal of Vacuum Science and Technology: Part B, AVS / AIP, Melville, New York, NY, US, vol. 27, No. 3, May 15, 2009, pp. 1142-1155, XP012129256, ISSN: 1071-1023, DOI: 10.1116/1.3136864.

The Institution of Electrical Engineers, Stevenage, GB; Feb. 26, 2013, Hsin-Yu Tsai et al: "Pattern Transfer of Directed Self-assembly (DSA) Patterns for CMOS Device Applications", XP002767964, Database accession No. 13751724 *abstract* & Advanced Etch Technology for Nanopatterning II, vol. 8685, Mar. 29, 2013, Proceedings of the SPIE—The International Society for Optical Engineering SPIE—The International Society for Optical Engineering USA ISSN: 0277-786X, DOI: 10.1117/12.2014259.

* cited by examiner

ETCHING METHOD

TECHNICAL FIELD

The present invention relates to an etching method.

BACKGROUND ART

In order to achieve further miniaturized semiconductor devices, a critical dimension needs to be made smaller than that achieved by microfabrication using a conventional photolithography technique.

As a next-generation microfabrication technique, a self-organizing block copolymer (BCP: blockcopolymer) that is one of self-organizing (self-assembled) materials spontaneously organizing an orderly pattern has been attracting attention (see Patent Document 1). More specifically, to begin with, a block copolymer layer containing a block copolymer containing two or more polymer block components A and B that do not mix with each other is applied to an underlayer film. After that, phase separation of the polymer block components A and B spontaneously occurs by annealing the block copolymer layer. One of the polymer components is selectively removed from the orderly pattern composed of nanosized structure units obtained by the above process by an etching. Then, a desired fine pattern can be obtained by transcribing the pattern to a substrate by using the remaining polymer component as a mask.

PRIOR ART DOCUMENTS

Patent Documents

Patent Document 1: Japanese Laid-Open Patent Application Publication No. 2001-151834

SUMMARY OF THE INVENTION

Problem to be Solved by the Invention

However, the method of using the block copolymer disclosed in Patent Document 1 has a problem of increasing values of LER (Line edge roughness) and/or LWR (Line width roughness) of the pattern obtained after etching the polymer component.

In response to the above problem, there is provided an etching method that can reduce values of LER and LWR of an obtained pattern.

Means for Solving the Problem

According to an embodiment of the present invention, there is provided an etching method for etching an object to be processed by using a substrate processing apparatus including a process chamber including a first electrode and a second electrode disposed opposite to the first electrode to receive the object to be processed thereon. The method includes a process of removing at least one of a first polymer and a second polymer by etching the object to be processed on which a pattern of the first polymer and the second polymer is formed by phase separation of a block copolymer containing the first polymer and the second polymer at a temperature lower than or equal to 10 degrees C. by using plasma of a process gas.

Advantageous Effect of the Invention

According to an etching method of an embodiment of the present invention, values of LER and LWR of an obtained pattern can be reduced.

EMBODIMENTS FOR IMPLEMENTING THE INVENTION

In the following, embodiments of the present invention are described with reference to the accompanying drawings. Note that elements having substantially the same configuration may be given the same reference numerals and overlapping descriptions thereof may be omitted.

(Self-assembled Block Copolymer (BCP))

A directed self-assembled technique (DSA: directed self-assembled technique) is known that forms a self-assembled periodic pattern by causing a first polymer and a second polymer constituting a block copolymer to become self-assembled on an object to be processed.

A brief description is given below of a self-assembly of the block copolymer. A block copolymer layer containing a first polymer and a second polymer that do not mix with each other is applied to an object to be processed. In this state, the block copolymer layer is treated with heat at a temperature from room temperature to 300 degrees C. Normally, phase separation of the block copolymer layer occurs when heating the block copolymer layer at a temperature from 200 degrees C. to 250 degrees C. Then, the block copolymer layer holds a phase-separated state even when the temperature is returned to room temperature after the phase separation.

When the polymer length of each polymer is short, the interaction therebetween (repulsive force) weakens, and hydrophilic properties strengthen. When the polymer length is long, the interaction therebetween (repulsive force) strengthens, and the hydrophilic properties weaken. By controlling the hydrophilic properties and/or the hydrophobic properties of the applied polymer and an adjacent layer while utilizing such properties of the polymer, a fine pattern composed of the first polymer and the second polymer that are sequentially arranged can be formed. Then, by selectively removing one of the first polymer and the second polymer by an etching process, a pattern composed of the other polymer can be formed.

In the embodiment, polystyrene (PS) and polymethylmethacrylate (PMMA) are used as the first polymer and the second polymer, respectively. In this case, the block copolymer is poly(styrene-b-methylmethacrylate). However, the embodiment is not limited to this diblock copolymer, but another chain block copolymer or a block copolymer having another structure such as a star copolymer, a branched polymer, hyperbranched copolymer and a graft copolymer, can be used.

As specific examples of the block copolymer available in the embodiment other than poly(styrene-b-methylmethacrylate), poly(styrene-b-vinylpyridine), poly(styrene-b-butadiene), poly(styrene-b-isoprene), poly(styrene-b-alkenyl aromatics), poly(isoprene-b-ethylene oxide), poly(styrene-b-(ethylene-propylene)), poly(ethylene oxide-b-polycaprolactone), poly(butadiene-b-ethylene oxide), poly(styrene-b-t-butyl methacrylate), poly(methylmethacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(methylmethacrylate-b-dimethylsiloxane), or diblock or triblock copolymer such as a combination containing at least one of the above-mentioned block copolymer, are cited.

(Etching Method)

Figure 1:
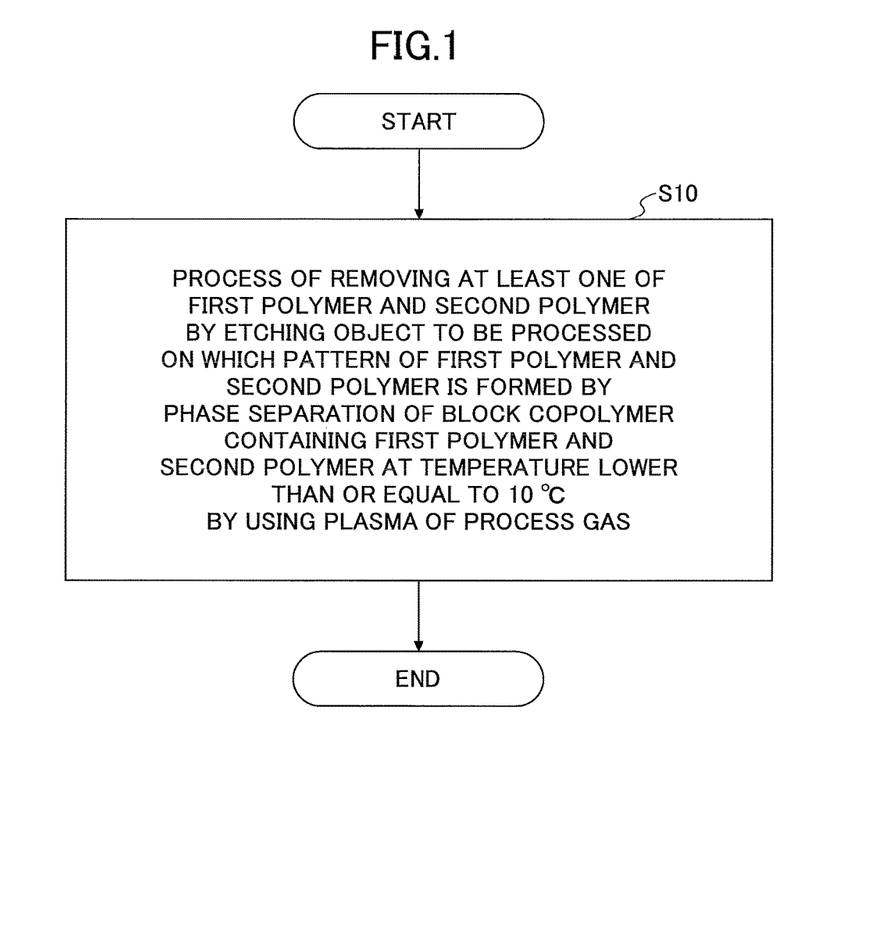
FIG. 1 is a flowchart of an example of an etching method according to an embodiment of the present invention.

FIG. 1 illustrates a flowchart of an example of an etching method according to an embodiment.

Inventors of the present invention have found that LER and/or LWR of a pattern after an etching can be improved by controlling a process temperature at a lower temperature lower than or equal to 10 degrees C., preferably 0 degrees C., further preferably −10 degrees C. when removing one of the first polymer and the second polymer by the etching in the pattern formation using a block copolymer. Moreover, the inventors have found that a selective ratio of the first polymer/the second polymer improves by decreasing a process temperature. Furthermore, the inventors have found that the controllability of the etching improves by decreasing the process temperature because an etching rate decreases.

That is, as illustrated in FIG. 1, the etching method of the embodiment includes a process of removing at least one of a first polymer and a second polymer by etching an object to be processed on which a pattern of the first polymer and the second polymer is formed by phase separation of a block copolymer containing the first polymer and the second polymer at a temperature lower than or equal to 10 degrees C. by using plasma of a process gas (S10).

Figure 2A:
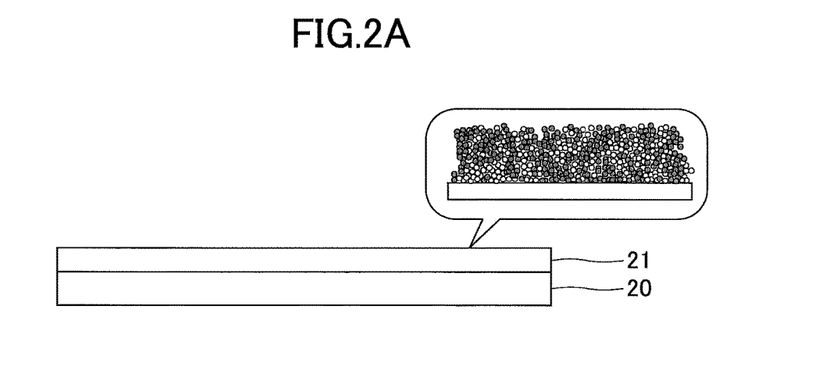
FIG. 2A is a first schematic view for explaining an example of an etching method according to an embodiment of the present invention.
Figure 2B:
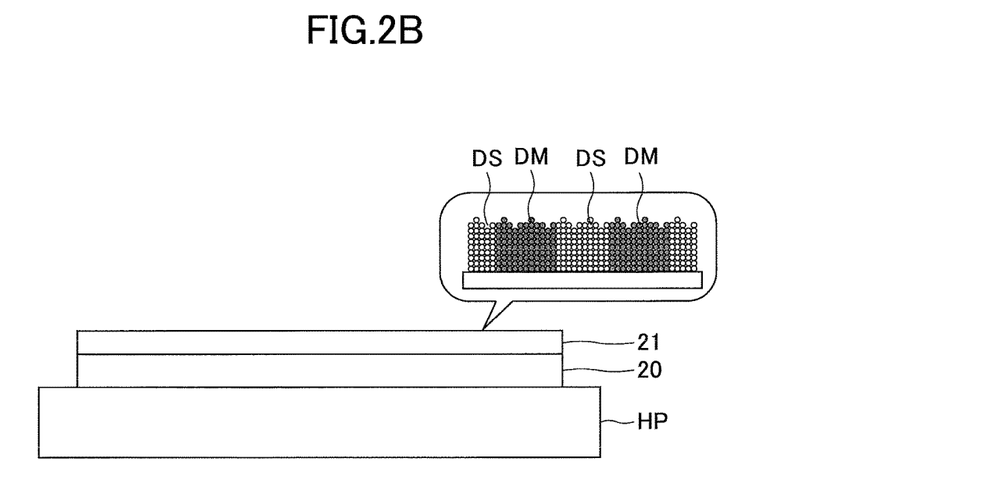
FIG. 2B is a second schematic view for explaining an example of an etching method according to an embodiment of the present invention.
Figure 2C:
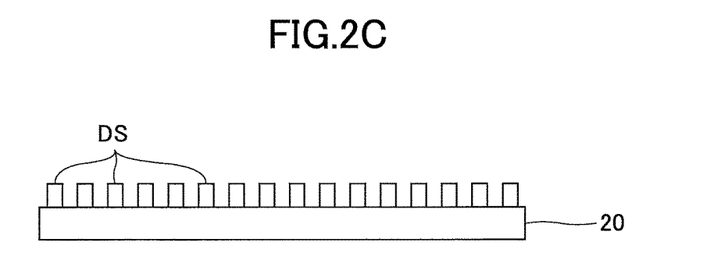
FIG. 2C is a third schematic view for explaining an example of an etching method according to an embodiment of the present invention.

A detailed description is given below of the etching method of the embodiment with reference to FIGS. 2A through 2C. FIGS. 2A through 2C illustrate schematic views for explaining an example of the etching method of the embodiment. Here, in FIGS. 2A through 2C, a brief description is given of an example of forming a block copolymer, which is an object to be etched, on an object to be processed as well as the detailed description of the etching method according to the embodiment. The description is given below by citing an example of using poly(styrene-b-methylmethacrylate) as the block copolymer.

To begin with, an application liquid of an organic solvent containing poly(styrene-b-methylmethacrylate) dissolved therein is prepared. The organic solvent is not particularly limited to a specific solvent as long as compatibility with polymers constituting the utilized copolymer is high depending on the utilized copolymer. For example, toluene, propylene glycol monomethyl ether acetate or the like is used.

Next, for example, the application liquid is applied to an upper surface of an object to be processed 20 by, for example, a spin coating method. As a result, as illustrated in FIG. 2A, a film 21 of poly(styrene-b-methylmethacrylate) is formed. In this film 21, as schematically illustrated in an inserted figure of FIG. 2A, PS polymer and PMMA polymer is mixed with each other.

Subsequently, as illustrated in FIG. 2B, the object 20 including the film 21 of poly(styrene-b-methylmethacrylate) formed thereon is put on a heater plate HP, and is heated to a predetermined temperature. This generates phase separation of poly(styrene-b-methylmethacrylate), and as schematically illustrated in an inserted figure of FIG. 2B, a PS area DS and a PMMA area DM are alternately arranged. Here, because the width of the area DS depends on a degree of polymerization of PS and the width of the area DM depends on a degree of polymerization of PMMA, a desired pattern in which the area DS and the area DM are repeatedly arranged at an equal pitch can be formed by adjusting the degrees of polymerization.

Next, as illustrated in FIG. 2C, a pattern constituted of the PS area DS is formed by selectively etching the PMMA area DM by using plasma of a process gas containing, for example, oxygen ($O_2$) and argon (Ar) and the like. The process gas is not limited to the above-mentioned gas as long as the process gas can selectively etch at least one of the polymers of two kinds of the polymers constituting the block copolymer depending on a kind of the utilized copolymer. Trifluoromethane ($CF_4$), hexafluoroethane ($C_2F_6$), trifluoromethane ($CHF_3$), difluoromethane ($CH_2F_2$), hexafluoroethane ($CF_3CF_3$), bromine (Br), nitrogen ($N_2$), nitrogen fluoride ($NF_3$), chlorine ($Cl_2$), carbon tetrachloride ($CCl_4$), hydrogen bromide (HBr), sulfur hexafluoride ($SF_6$) and the like are cited as specific examples of the process gas in addition to the above-mentioned $O_2$ and Ar. Among these process gases, using a non-deposition type process gas is preferable, and using a mixed gas of $O_2$ gas and Ar gas is more preferable. The selectivity during the etching improves when using a deposition type process gas, but sometimes a wiggle occurs after the etching due to the collapse of the pattern and the like.

Moreover, when using the mixed gas of $O_2$ gas and Ar gas, the process gas preferably further contains carbon monoxide (CO) and carbon dioxide ($CO_2$) as additional gases. The LER and/or the LWR of the obtained pattern become low by adding these gases to the process gas, which is preferable.

Although a flow rate of the process gas during the etching is not particularly limited to a specific value, a total flow of the process gas is preferably low. When using $O_2$ gas and Ar gas, the total flow of $O_2$ gas and Ar gas is preferably set to be lower than or equal to 1000 sccm. The LER and/or the LWR of the obtained pattern are likely to become low by reducing the total flow of the process gas. As discussed above, the LER and/or the LWR of the obtained pattern become low when the total flow of the process gas is set to be low, but sometimes the etching rate becomes fast and the control of the etching process becomes technically difficult. In this case, for example, by adjusting another adjusting means such as an output of high frequency power described later and the like, improving the etching controllability is preferable.

Furthermore, when using $O_2$ gas and Ar gas, a partial pressure of $O_2$ gas may be set to be low within a range where an etching rate of a neutral film described later under the polymer layer is ensured. In general, although the LER and/or the LWR become high when the partial pressure of $O_2$ gas is made low, a remaining amount of mask of the remaining PS film is likely to become high. Hence, when applying the etching to the intended purpose requiring a great remaining amount of mask, decreasing the partial pressure of $O_2$ gas is preferable. In addition, by decreasing the partial pressure of $O_2$ gas, the etching rate decreases, thereby improving the etching controllability.

Moreover, the residence time during the etching is preferably made longer. In the embodiment, the residence time is preferably set in a range from 2 seconds to 13 seconds although the residence time also depends on other etching conditions and an apparatus configuration. The residence time is preferably made longer in this range of the residence time. This causes the etching rate of the neutral film under the polymer layer and the selectivity to improve, which is preferable. Here, the residence time means a retention period of a process gas staying in a part where the process gas contributes to the etching in an etching apparatus. More specifically, when expressing an effective chamber volume obtained by multiplying an area of wafer by a distance between electrodes as V (L), a pressure in a process chamber as P (mTorr), and a flow rate of the process gas as S (sccm), the residence time τ is calculated by the following formula 1.

$$\tau = P*V/S \qquad \text{(formula 1)}$$

Supplying high frequency power (LF) for bias to a lower electrode of the etching apparatus described later is preferable during the etching. Supplying the high frequency power for bias to the lower electrode facilitates the vertical emission of etching ions caused by the process gas, which makes it possible to obtain a pattern having the low LER and/or LWR.

The etching method of the embodiment preferably further includes a process of improving (curing) a film quality of the polymer (layer) either before or after the process of removing the polymer of step S10. This enables the LER and/or the LWR of the obtained pattern to further decrease. In addition, the degradation of mechanical strength of the pattern and even the deterioration of the film quality can be prevented.

A method of irradiating the polymer layer with UV light by using an ultraviolet (UV) light irradiation device, a method of performing a plasma process on the polymer layer by using plasma of a process gas containing hydrogen ($H_2$) gas and the like are cited as methods of improving the film quality. Here, in general, a mixed gas of $H_2$ gas, nitrogen ($N_2$) gas and methane ($CH_4$) gas, a mixed gas of $H_2$ gas and Ar gas and the like are used as the process gas containing $H_2$ gas used in the plasma process.

(Object to be Processed)

The object to be processed on which the block copolymer layer is formed, which is subject to the etching method of the embodiment, is not particularly limited. For example, a substrate for electronic parts, one in which a predetermined pattern is formed and the like are available. More specifically, a silicon wafer substrate, a metal substrate made of coper, chrome, iron, aluminum and the like, a glass substrate and the like can be used as the substrate. Moreover, for example, copper, aluminum, nickel, gold and the like are cited as specific examples of a material of a wiring pattern.

Furthermore, the above-mentioned substrate on which, for example, a neutral film is formed may be used as the object to be processed. The neutral film is not particularly limited to a specific film, and a conventional film can be used as the neutral film. As an example of a method of manufacturing the neutral film, applying a predetermined solvent in which a random copolymer of polystyrene (PS) and poly methylmethacrylate (PMMA) is dissolved and treating the applied solvent with heat for a few minutes to several hours and the like, are cited. Moreover, an inorganic-based film (inorganic film) and/or an organic-based film (organic film) may be provided between the object to be processed, the above-mentioned substrate, and the neutral film. For example, an inorganic antireflection coating (inorganic ARC) is cited as an example of the inorganic film. An organic antireflection coating (organic ARC), an underlayer film in a multi-layer resist method and the like are cited as examples of the organic film.

Here, in the etching method of the embodiment, only one of the first polymer and the second polymer may be etched, or the underlayer film such as the neutral film that can exist under the etched polymer may be also etched.

(Etching Apparatus)

Figure 3:
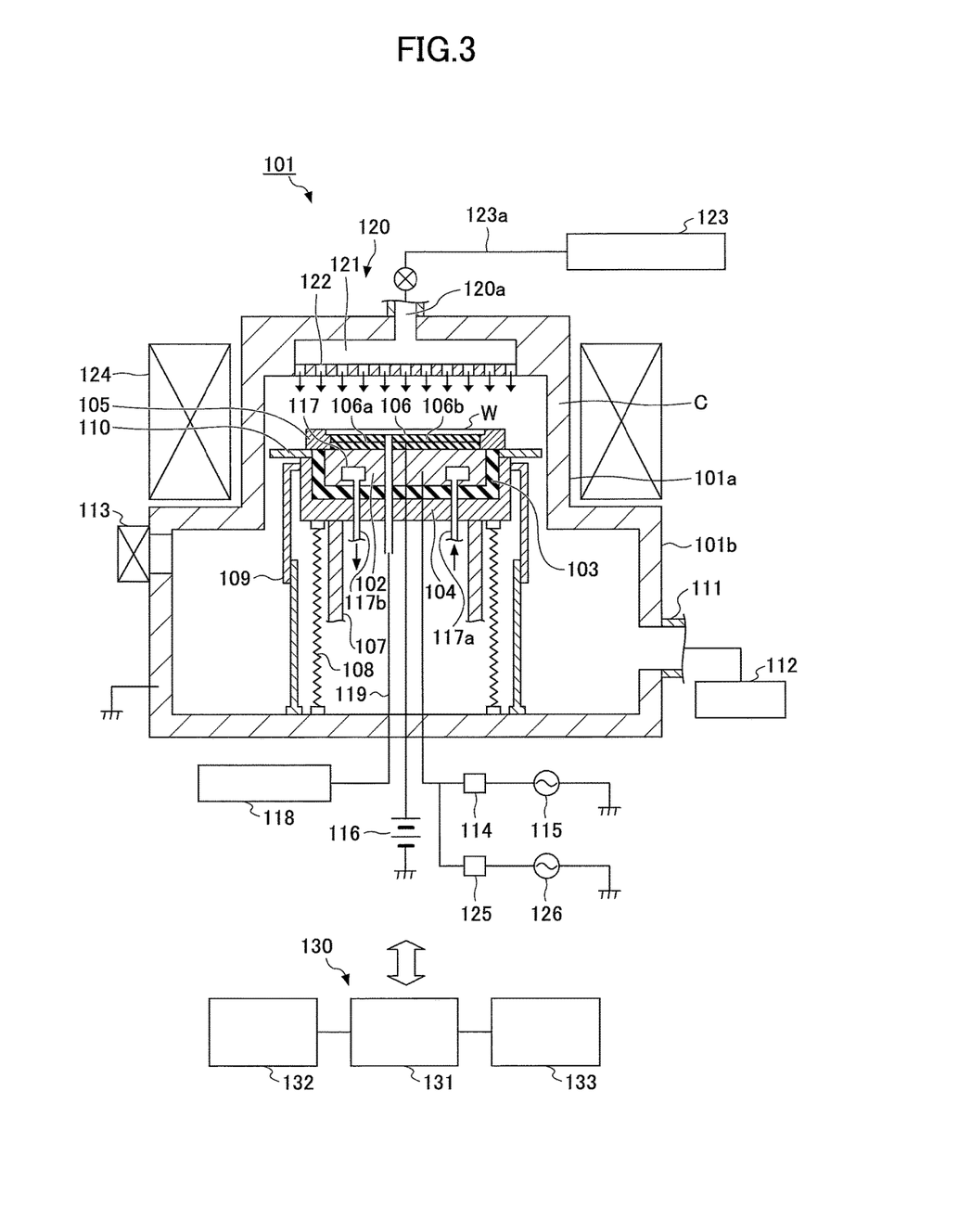
FIG. 3 is a schematic configuration diagram of an example of a capacitively coupled plasma etching apparatus according to an embodiment of the present invention.

Next, a description is given below of an example of an etching apparatus that can perform the etching method according to the embodiment with reference to FIG. 3. FIG. 3 illustrates a schematic configuration diagram of an example of a capacitively coupled plasma etching apparatus according to an embodiment.

The plasma etching apparatus 101 is made of metal such as aluminum, stainless steel or the like, and includes a grounded chamber C.

For example, a pedestal 102 for receiving a wafer W thereon is provided inside the chamber C. The pedestal 102 is made of, for example, aluminum and the like, and is supported by a support 104 made of a conductor via an insulating member 103.

A focus ring 105 made of, for example, silicon, quartz or the like, is disposed on a periphery of an upper surface of the pedestal 102. An electrostatic chuck 106 for holding the wafer W thereon by an electrostatic force is provided on the upper surface of the pedestal 102.

The pedestal 102 and the support 104 are configured to be able to move up and down by an elevating mechanism including ball screws 107. An area under the support 104 is covered with a bellows 108 made of stainless steel and the like. A bellows cover 109 is provided outside the bellows 108.

A lower surface of the focus ring 105 is connected to a baffle plate 110, and the focus ring 105 is electrically connected with the chamber C through the baffle plate 110, the support 104 and the bellows 108.

The chamber C includes an upper chamber 101a, and a lower chamber 101b having a diameter larger than that of the upper chamber 101a. An exhaust opening 111 is formed in a side wall of the lower chamber 101b. An exhaust device 112 is connected to the exhaust opening 111 through an exhaust pipe. For example, a vacuum pump and the like are used as the exhaust device 112, and a process space in the chamber C can be evacuated to a predetermined degree of vacuum by operating the vacuum pump and the like.

A gate valve 113 that opens and closes a transfer opening of the wafer W is attached to the side wall of the lower chamber 101b.

A first high frequency power source 115 for plasma generation and reactive ion etching (RIE) is electrically connected to at least one of the pedestal 102 and a shower head 120 configured to be an upper electrode described later. The first high frequency power source 115 supplies high frequency power having an output of, for example, 100 W to 300 W to the pedestal 102 or the shower head 120 as the high frequency power (HF) for plasma generation. Here, FIG. 3 illustrates an example of the first high frequency power source 115 electrically connected to the pedestal 102, that is, the lower electrode.

The output of the high frequency power (HF) for plasma generation is not limited, but is preferably set at a high output in an output range of 100 W to 300 W. The LER and/or the LWR of the pattern after the etching can be reduced by making the output of the high frequency power (HF) for plasma generation high. Also, a remaining amount of mask after the etching can be made great.

A second high frequency power source 126 is preferably electrically connected to the pedestal 102 through a matching box 125. The second high frequency power source 126 supplies superimposed high frequency power having an output of, for example, 0 W to 100 W to the pedestal 102 as the high frequency power (LF) for bias. For example, when an object to be processed including a block copolymer formed on a neutral film is provided and both of a polymer film to be etched and the neutral film under the polymer film are etched, sometimes the selectivity cannot be sufficiently secured because the neutral film is a relatively hard film. In this case, great selectivity can be secured by supplying the high frequency power for bias and etching the polymer to be etched and the neutral film under this polymer film.

Preferably, the high frequency power (LF) for bias is intermittently supplied, that is, in a pulsed manner. This allows the remaining amount of film (remaining amount of mask) of the PS film and the neutral film under the PS film to become great.

Here, when a period of time when the high frequency power is supplied is expressed as Ton and a period of time when the high frequency power is not supplied is expressed as Toff, pulsed high frequency power of a frequency of $1/(Ton+Toff)$ is supplied to the electrodes. In general, the frequency of $1/(Ton+Toff)$ is about 1 kHz to 100 kHz. Moreover, in this case, a duty ratio is expressed by a ratio of the supplied period of time Ton to a total period of time of the supplied period of time Ton and the not supplied period of time Toff, that is, by $Ton/(Ton+Toff)$. The duty ratio is generally 10% to 90%.

The output of the high frequency power (LF) for bias is not limited, but is preferably set at a high output in a range from 0 W to 100 W. The LER and/or the LWR of the pattern after the etching can be reduced by making the high frequency power (LF) for bias high. However, the output of the high frequency power (LF) for bias is preferably set at about 100 W because the high frequency power has a negative impact on the plasma generation and the control of the etching becomes difficult.

The shower head 120 is provided in a ceiling part of the chamber C. The shower head 120 is maintained at ground potential, and functions as the upper electrode.

An electrostatic chuck configured to dispose an electrode 106*a* made of a conductive film sandwiched between a pair of insulating sheets 106*b* and the like can be used as the electrostatic chuck 106. A direct current voltage source 116 is electrically connected to the electrode 106*a*. The wafer W is electrostatically attracted to the electrostatic chuck 106 by an electrostatic attractive force caused by a direct current voltage from the direct current voltage source 116.

A refrigerant chamber 117, for example, extending along a circumferential direction is provided inside the pedestal 102. A refrigerant of a predetermined temperature is supplied to and circulated through the refrigerant chamber 117 by a chiller unit not illustrated in the drawings via pipes 117*a* and 117*b*. The temperature of the wafer W on the pedestal 102 is controlled so as to become a predetermined processing temperature by a temperature of the circulating refrigerant.

Furthermore, a heat transfer gas from a gas supply mechanism 118, for example, helium (He) gas, is supplied to a location between the upper surface of the electrostatic chuck 106 and the back surface of the wafer W through a gas supply line 119. The gas supply mechanism 118 is provided in a manner capable of independently controlling gas pressures of a central part of the wafer W and a peripheral part of the wafer W in order to enhance uniformity of the etching process across the surface of the wafer W.

The shower head 120 is arranged so that the lower surface thereof faces the upper surface of the pedestal 102, and many gas discharge holes 122 are provided in the lower surface of the shower head 120. In addition, a buffer chamber 121 in communication with the gas discharge holes 122 is provided inside the shower head 120 and on the upper side of the gas discharge surface. A gas supply source 123 is connected to a gas introduction port 120*a* of the buffer chamber 121 through a gas supply pipe 123*a*. The process gas is supplied to the buffer chamber 121 from the gas supply source 123.

A dipole ring magnet 124 extending annularly or concentrically is disposed around the upper chamber 101*a*. The dipole ring magnet 124 is configured to be able to form a uniform horizontal magnetic field heading for one direction as a whole, for example, by arranging a plurality of, for example, 16 anisotropic segmented columnar magnets at regular intervals in a circumferential direction. Not only an RF electronic field is formed in a vertical direction, but also a magnetic field is formed in a horizontal direction by the high frequency power from the high frequency power source 115 in a space between the pedestal 102 and the shower head 120 by arranging the dipole ring magnet 124. High-density plasma is generated in the vicinity of the surface of the pedestal 102 by a magnetron discharge using the orthogonal electromagnetic field.

The plasma etching apparatus of the above configuration is integrally controlled by a control unit 130. The control unit 130 includes a CPU 131 (Central Processing Unit), a ROM 132 (Read Only Memory), and a RAM 133 (Random Access Memory). The CPU 131 performs a plasma process in accordance with a variety of recipes stored in a memory area such as the RAM 133. The recipe specifies process time, a temperature within the process chamber (upper electrode temperature, side wall temperature of process chamber, ESC temperature and the like), a pressure (exhaust gas pressure), high frequency power or voltage, a flow rate of the process gas, a flow rate of the heat transfer gas and the like.

Subsequently, more detailed description is given below of the present invention by citing specific examples. Here, in the present specification, poly(styrene-b-methylmethacrylate) was used as the block copolymer, and poly(styrene-b-methylmethacrylate) was selectively etched by using a process gas containing Ar gas and $O_2$ gas in all embodiments, but the present invention is not limited to the embodiments.

(First Embodiment)

A description is given below of an embodiment in which it was confirmed that the LER and/or the LWR of a pattern after an etching could be improved by controlling a processing temperature so as to become a low temperature when removing one of a first polymer and a second polymer by the etching.

Poly(styrene-b-methylmethacrylate) was formed on an object to be processed on which at least a neutral film was formed by the above-mentioned method. The object to be processed on which PS and PMMA was alternately arranged at a predetermined pitch was obtained by heating the object to be processed to a predetermined temperature.

With respect to the obtained object to be processed, PS and PMMA and the neutral film thereunder were selectively etched by using an etching apparatus of which example is illustrated in FIG. 3. The etching conditions were set in the following.

Gas Type/Gas Flow Rate: $O_2$/Ar=20-30/340-510 sccm;
Temperature of Lower Part of Object to be Processed: 10 degrees C. or −10 degrees C.; and
Etching Time: 15 seconds.
The other etching conditions were made the same.

Here, the temperature of the lower part of the object to be processed was controlled so as to become 10 degrees C. or −10 degrees C. by introducing a refrigerant in the refrigerant chamber 117.

TABLE 1 shows a result of a fine pattern after the etching under each of the etching conditions.

TABLE 1

|  | EXAMPLE 1 | EXAMPLE 2 |
|---|---|---|
| TEMPERATURE OF OBJECT TO BE PROCESSED (° C.) | −10 | 10 |
| LER (nm) | 1.2 | 1.5 |
| LWR (nm) | 1.4 | 1.8 |
| REMAINING AMOUNT OF PS FILM AND NEUTRAL FILM (nm) | 25.8 | 25.1 |
| BOTTOM LINE WIDTH (nm) | 11.9 | 11.9 |

TABLE 1 shows that the LER and/or the LWR can be reduced of the obtained pattern by decreasing a temperature of the object to be processed, that is, an etching temperature from 10 degrees C. to −10 degrees C. Although not shown in TABLE 1, the example of setting the temperature of the object to be processed at 10 degrees C. has the LER and/or the LWR significantly lower than the example of setting the temperature of the object to be processed at room temperature.

Moreover, as shown in TABLE 1, by making the etching temperature low, a remaining amount of film (remaining amount of mask) of the PS film and the neutral film under the PS film increased. It is probably caused because the etching rate of the PMMA film and the neutral film under this PMMA film became relatively high to the etching rate of the PS film by making the etching temperature low.

The above results have indicated that the LER and/or LWR of the obtained pattern can be improved and the mask selectivity during the etching can be improved by making the etching temperature low.

(Modification of First Embodiment)

As a modification of the first embodiment, regarding an object to be processed on which PS and PMMA were alternately arranged at a predetermined pitch, PMMA and a neutral film under the PMMA film were selectively etched under the following etching conditions. The etching conditions were set as follows:
Gas Type/Gas Flow Rate: $O_2$/Ar=40-60/680-1020 sccm;
Lower Part Temperature of Object to be Processed: 10 degrees C. or 20 degrees C.; and
Etching Time: 32 seconds (Example of 10 degrees C.) or 15 seconds (Example of 20 degrees C.).
The other etching conditions were made the same.

With respect to each of the examples, an etching rate $ER_{PMMA}$ of PMMA and an etching rate $ER_{PS}$ of PS were obtained, and a value of ratio thereof $ER_{PMMA}/ER_{PS}$ was obtained. As a result, the etching rate ratio $ER_{PMMA}/ER_{PS}$ of the example where the lower part temperature of the object to be processed was 10 degrees C. was 5.0, and the etching rate ratio $ER_{PMMA}/ER_{PS}$ of the example where the lower part temperature of the object to be processed was 20 degrees C. was 1.6. These results have indicated that the mask selectivity during the etching can be improved by making the etching temperature low.

(Another Modification of First Embodiment)

Furthermore, as another modification of the first embodiment, regarding an object to be processed on which PS and PMMA were alternately arranged at a predetermined pitch, PMMA and a neutral film under the PMMA film were selectively etched under the following etching conditions. The etching conditions were set as follows:
Gas Type/Gas Flow Rate: $O_2$/Ar=40-60/680-1020 sccm;
Lower Part Temperature of Object to be Processed: 10 degrees C. or 30 degrees C.; and
Etching Time: 10 seconds.
The other etching conditions were made the same.

TABLE 2 shows a result of a fine pattern after the etching under each of the etching conditions.

TABLE 2

|  | EXAMPLE 3 | EXAMPLE 4 |
|---|---|---|
| TEMPERATURE OF OBJECT TO BE PROCESSED (° C.) | 10 | 30 |
| REMAINING AMOUNT OF NEUTRAL FILM (nm) | 0~4.0 | N/D |
| REMAINING AMOUNT OF PS FILM AND NEUTRAL FILM (nm) | 22.5 | 14.5 |

As shown in TABLE 2, by decreasing the temperature of the object to be processed, that is, the etching temperature, from 30 degrees C. to 10 degrees C., a remaining amount of film (remaining amount of mask) of the PS film and the neutral film under the PS film increased. That is, the examples have indicated that the mask selectivity during the etching can be improved by making the etching temperature low.

As discussed above, the first embodiment has indicated that the LER and/or the LWR of the pattern after the etching, and the mask selectivity can be improved by controlling the process temperature so as to become low.

(Second Embodiment)

A description is given below of an embodiment performed to confirm that the LER and/or the LWR can be reduced by adjusting the high frequency power (HF) for plasma generation and the high frequency power (LF) for bias.

To begin with, a description is given below of the embodiment performed to confirm that the LER and/or the LWR can be reduced by adjusting the high frequency power (HF) for plasma generation.

By performing an etching process on an object to be processed on which PS and PMMA were alternately arranged at a predetermined pitch, PMMA was selectively etched under the following etching conditions. The etching conditions were set as follows:
High Frequency Power: HF/LF=100, 200 or 300/100 W;
Gas Type/Gas Flow Rate: $O_2$/Ar=40-60/680-1020 sccm; and
Etching Time: 15 seconds (Example of HF=100 W), 10 seconds (Example of HF=200 W) or 8 seconds (Example of HF=300 W).

TABLE 3 shows a result of a fine pattern of the etching under each of the etching conditions.

TABLE 3

|  | EXAMPLE 5 |
|---|---|
| TEMPERATURE OF OBJECT TO BE PROCESSED (° C.) | 10 |

TABLE 3-continued

|  | EXAMPLE 5 | | |
| --- | --- | --- | --- |
| OUTPUT OF HF (W) | 100 | 200 | 300 |
| LER (nm) | 2.9 | 1.9 | 1.6 |
| LWR (nm) | 4.2 | 2.0 | 2.0 |
| REMAINING AMOUNT OF PS FILM AND NEUTRAL FILM (nm) | 9.9 | 19.2 | 20.5 |

TABLE 3 has indicated that the LER and/or the LWR can be reduced by increasing an output of the high frequency power (HF) for plasma generation. Moreover, TABLE 3 has indicated that a remaining amount of film (remaining amount of mask) of the PS film can be improved by making the output of the high frequency power (HF) for plasma generation high.

(Modification of Second Embodiment)

Next, a description is given below of an embodiment performed to confirm that the LER and/or the LWR can be reduced by supplying the high frequency power (LF) for bias to the lower electrode of the etching apparatus.

By performing an etching process on an object to be processed on which PS and PMMA were alternately arranged at a predetermined pitch, PMMA was selectively etched under the following etching conditions. The etching conditions were set as follows:

High Frequency Power: HF/LF=200 W/0, 50 or 100 W;
Gas Type/Gas Flow Rate: $O_2$/Ar=40-60/680-1020 sccm;
Lower Temperature of Object to be Processed: 10 degrees C.; and
Etching Time: 80 seconds (Example of LF=0 W), 15 seconds (Example of LF=500 W) or 10 seconds (Example of LF=100 W).

The other etching conditions were made the same.

TABLE 4 shows a result of a fine pattern of the etching under each of the etching conditions.

TABLE 4

|  | EXAMPLE 6 | | |
| --- | --- | --- | --- |
| TEMPERATURE OF OBJECT TO BE PROCESSED (° C.) | 10 | | |
| OUTPUT OF LF (W) | 0 | 50 | 100 |
| LER (nm) | 2.7 | 2.1 | 1.9 |
| LWR (nm) | 4.6 | 2.0 | 2.0 |
| REMAINING AMOUNT OF PS FILM AND NEUTRAL FILM (nm) | 11.9 | 14.8 | 19.2 |

TABLE 4 has indicated that the LER and/or the LWR of the pattern after the etching can be reduced by supplying the high frequency power (LF) for bias. A remaining amount of film (remaining amount of mask) of the PS film can be improved by supplying the high frequency power (LF) for bias.

As discussed above, the second embodiment has indicated that the LER and/or the LWR can be reduced by adjusting the high frequency power (HF) for plasma generation and the high frequency power (LF) for bias.

(Third Embodiment)

Subsequently, a description is given below of an embodiment performed to confirm that the LER and/or the LWR of an obtained pattern can be reduced by performing a film quality improvement before or after the etching process.

By performing an etching process on an object to be processed on which PS and PMMA were alternately arranged at a predetermined pitch, PMMA was selectively etched under the following etching conditions. The etching conditions were set as follows:

Gas Type/Gas Flow Rate: $O_2$/Ar=40-60/680-1020 sccm; and

Lower Temperature of Object to be Processed: 10 degrees C.

After that, the film quality of the remaining PS polymer layer was improved by a plasma process by a process gas containing $H_2$ gas and Ar gas.

The LER of the obtained pattern was 2.5 nm, and the LWR was 2.5 nm. The remaining amount of film of the PS film was 13.9 nm, and a line width of the bottom portion of the pattern was 11.0 nm. These results have indicated that the LWR and/or the LER can be improved by performing the film quality improvement process before or after the etching process of the embodiment. In addition, the results have indicated that the mask selectivity during the etching can be improved.

Here, in the present embodiment, the description has been given of an embodiment performing the film quality improvement process after the etching process, but the present invention is not limited to this point, and thus the film quality improvement process may be performed before the etching process. Moreover, with respect to the method of improving the film quality, the description has been given of the method of using the plasma of the process gas containing $H_2$ gas, but the present invention is not limited to this point, and thus a method of emitting UV light and the like may be adopted.

As discussed above, the third embodiment has indicated that the LER and/or the LWR of the obtained pattern can be improved by performing the film quality improvement process of the polymer film before or after the etching process.

(Fourth Embodiment)

Next, a description is given below of an embodiment performed to confirm that the LER and/or the LWR of the obtained pattern can be reduced by reducing a flow rate of a process gas during the etching process.

By performing an etching process on an object to be processed on which PS and PMMA were alternately arranged at a predetermined pitch, PMMA and a neutral film under PMMA were selectively etched under the following etching conditions. The etching conditions when a pressure was set at, for example, 30 mTorr, were set as follows:

Gas Type/Gas Flow Rate: $O_2$/Ar=40-60/680-1020 sccm (1.7 mTorr), 12.8-19.2/340-510 sccm (1.1 mTorr) or 25.6-38.4/680-1020 sccm.

The other etching conditions were made the same.

TABLE 5 shows a result of a fine pattern of the etching under each of the etching conditions.

TABLE 5

|  | EXAMPLE 7 | EXAMPLE 8 | EXAMPLE 9 |
| --- | --- | --- | --- |
| TEMPERATURE OF OBJECT TO BE PROCESSED (° C.) | 10 | 10 | 10 |
| FLOW RATE $O_2$/Ar (sccm) | 40~60/ 680~1020 | 12.8~19.2/ 340~510 | 25.6~38.4/ 680~1020 |
| PARTIAL PRESSURE OF $O_2$ (mT) | 1.7 | 1.1 | 1.1 |
| LER (nm) | 2.2 | 1.5 | N/D |
| LWR (nm) | 2.5 | 1.9 | N/D |
| REMAINING AMOUNT OF PS FILM AND | 12.6 | 15.2 | 21.8 |

TABLE 5-continued

|  | EXAMPLE 7 | EXAMPLE 8 | EXAMPLE 9 |
|---|---|---|---|
| NEUTRAL FILM (nm) |  |  |  |
| BOTTOM LINE WIDTH (nm) | 13.2 | 12.2 | 12.2 |

TABLE 5 has clearly indicated, from comparison of example 7 with example 8, that the LER and/or the LWR of the obtained pattern can be reduced by reducing a total flow rate of the process gas during the etching.

Furthermore, TABLE 5 has clearly indicated, from comparison of example 7 with example 9, that a remaining amount of mask during the etching can be improved by decreasing a partial pressure of $O_2$ gas in the process gas during the etching.

As discussed above, the fourth embodiment has indicated that the LER and/or the LWR of the obtained pattern can be improved by controlling the total flow rate of the process gas and the partial pressure of $O_2$ gas during the etching.

(Fifth Embodiment)

Subsequently, a description is given below of an embodiment performed to confirm that the LER and/or the LWR of the obtained pattern can be reduced by using a process gas obtained by adding CO or $CO_2$ to a mixed gas of $O_2$ gas and Ar gas.

By performing an etching process on an object to be processed on which PS and PMMA were alternately arranged at a predetermined pitch, PMMA and a neutral film under PMMA were selectively etched under the following etching conditions. The etching conditions were set as follows:

Gas Type/Gas Flow Rate: $O_2$/Ar/CO=40-60/680-1020/0 or 40-60 sccm; and

Lower Temperature of Object to be Processed: 10 degrees C.

The other etching conditions were made the same.

TABLE 6 shows a result of a fine pattern of the etching under each of the etching conditions.

TABLE 6

|  | EXAMPLE 10 | EXAMPLE 11 |
|---|---|---|
| TEMPERATURE OF OBJECT TO BE PROCESSED (° C.) | 10 | 10 |
| FLOW RATE OF CO (sccm) | 0 | 40~60 |
| LER (nm) | 1.5 | 1.3 |
| LWR (nm) | 1.0 | 1.3 |
| REMAINING AMOUNT OF PS FILM AND NEUTRAL FILM (nm) | 25.1 | 23.1 |

TABLE 6 has indicated that the LER and/or the LWR of a surface of the obtained pattern can be improved by adding CO to the process gas of the etching. Here, although CO was selected as the added gas in the present embodiment, the LER and/or the LWR can be similarly improved even if $CO_2$ was added.

As discussed above, the fifth embodiment has indicated that the LER and/or the LWR of the obtained pattern can be improved by adding CO or $CO_2$ to the process gas during the etching.

(Sixth Embodiment)

Next, a description is given below of an embodiment performed to confirm that the LER and/or the LWR of the obtained pattern can be reduced by controlling the residence time during the etching.

By performing an etching process on an object to be processed on which PS and PMMA were alternately arranged at a predetermined pitch, PMMA and a neutral film under PMMA were selectively etched under the following etching conditions. The etching conditions were set as follows:

Residence Time: 1.22 seconds, 1.83 seconds, 4.27 seconds, 13.42 seconds; and

Lower Temperature of Object to be Processed: 10 degrees C.

The other etching conditions were made the same.

As an example, in the example of the residence time of 4.27 seconds, the LER of the obtained pattern was 1.6 nm, and the LWR of the obtained pattern was 1.8 nm. Also, a remaining amount of film of the PS film and the neutral film under the PS film was 20.5 nm. Here, in the other etching conditions (residence time), the patterns having preferable roughness properties could be obtained.

From this, the etching method according to the sixth embodiment has indicated that the remaining amount of film (remaining amount of mask) of the PS film and the neutral film under this PS film can be increased by controlling the residence time because the etching rate of the neutral film under the PMMA film improves and the selectivity improves. In addition, because the etching method according to the present embodiment performs the etching while setting the temperature of the object to be processed at a temperature lower than or equal to 10 degrees C., the LER and/or the LWR of the obtained pattern is preferable.

As discussed above, although the description of the embodiments has been given, the present invention is not limited to the above embodiments. These embodiments can be changed, modified and/or combined without departing from the scope of the present invention.

Although the present invention has been described in detail and by citing the specific embodiments, it is apparent for a person skilled in the art that various modification and improvements can be made without departing from the scope of the present invention.

The present application is based on and claims the benefit of priority of Japanese Patent Application No. 2013-178583 filed on Aug. 29, 2013, the entire contents of which are herein incorporated by reference.

DESCRIPTION OF THE REFERENCE NUMERALS 20 object to be processed
21 film
101 plasma etching apparatus
102 pedestal
103 Insulating member
104 support
105 focus ring
106 electrostatic chuck
110 exhaust outlet
111 exhaust pipe
112 exhaust opening
113 gate valve
114 matching box
115 first high frequency power source
116 direct current voltage source
117 refrigerant chamber 118 gas supply mechanism
119 gas supply line
120 shower head
121 buffer chamber
122 gas discharge holes
123 gas supply source
124 dipole ring magnet
125 matching box
126 second high frequency power source
130 control unit

The invention claimed is:

1. An etching method for etching an object to be processed by using a substrate processing apparatus including a process chamber including a first electrode and a second electrode disposed opposite to the first electrode to receive the object to be processed thereon, the method comprising a step of:

forming a pattern of the first polymer and the second polymer on a substrate by performing a phase separation of the block copolymer containing the first polymer and the second polymer, removing one of a first polymer and a second polymer by etching the object to be processed on which the pattern of the first polymer and the second polymer is formed so that only one of the first polymer and the second polymer remains on the substrate, said etching being performed at a temperature lower than or equal to 10 degrees C. by using plasma of a process gas, performing a film quality improvement process, that is a different process from the removing step, by curing the pattern of the first polymer and the second polymer on the substrate by plasma of $H_2$ containing gas before the removing the one of the first polymer and the second polymer, and performing a transfer of a pattern of the remaining polymer by using the remaining polymer as a mask after the film quality improvement process.

2. The etching method as claimed in claim 1,
wherein the first polymer is polystyrene,
wherein the second polymer is poly(methylmethacrylate), and
wherein the process gas contains oxygen gas and argon gas.

3. The etching method as claimed in claim 2,
wherein the object to be processed includes at least a film and the block copolymer sequentially stacked on a substrate, and
wherein the step of removing the at least one of the first polymer and the second polymer is a step of removing poly(methylmethacrylate) and a neutral film under poly(methylmethacrylate).

4. The etching method as claimed in claim 2,
wherein the process gas contains carbon monoxide or carbon dioxide.

5. The etching method as claimed in claim 2, wherein a partial pressure of oxygen gas in the step of removing the at least one of the first polymer and the second polymer is lower than or equal to 1.1 mTorr.

6. The etching method as claimed in claim 1,
wherein the step of removing the at least one of the first polymer and the second polymer includes a step of etching the object to be processed at a temperature lower than or equal to −10 degrees C.

7. The etching method as claimed in claim 1,
wherein the substrate processing apparatus includes a first high frequency power source configured to supply first high frequency power for plasma generation to the at least one of the first electrode and the second electrode and a second high frequency power source configured to supply second high frequency power for bias, and
wherein an output of the first high frequency power is in a range of 100 W to 300 W, and an output of the second high frequency power is in a range of 0 W to 100 W.

8. The etching method as claimed in claim 7,
wherein the second high frequency power is intermittently supplied in the step of removing the at least one of the first polymer and the second polymer.

9. The etching method as claimed in claim 1, wherein the $H_2$ containing gas is a mixed gas of hydrogen and argon, or a mixed gas of hydrogen, nitrogen and methane.

10. The etching method as claimed in claim 1, wherein a total flow rate of the process gas in the step of removing the at least one of the first polymer and the second polymer is lower than or equal to 1000 sccm.

11. The method as claimed in claim 1, wherein a value of residence time expressed as P*V/S is in a range of 2 seconds to 13 seconds when an effective chamber volume obtained by multiplying an area of the object to be processed by a distance between the first electrode and the second electrode is expressed as V (L), a pressure in the process chamber is expressed as P (mTorr), and a flow rate of the process gas is expressed as S (sccm).

12. The etching method as claimed in claim 1, wherein the removing step also etches a neutral film under the at least one of the first polymer and the second polymer by using the remaining polymer as a mask.

13. The etching method as claimed in claim 1, wherein said etching step is performed by using plasma of the process gas including oxygen and argon so that the etching step is performed in a different condition from the film quality improvement process.

14. The etching method as claimed in claim 1, wherein the film quality improvement process is performed by emitting UV light on the first polymer and the second polymer instead of the plasma of $H_2$ containing gas.

* * * * *